United States Patent [19]
Holler, Jr.

[11] Patent Number: 5,559,458
[45] Date of Patent: Sep. 24, 1996

[54] RESET CIRCUIT FOR A PIPELINED SIGNAL PROCESSOR

[75] Inventor: Paul T. Holler, Jr., Allentown, Pa.

[73] Assignee: Lucent Technologies Inc., Murray Hill, N.J.

[21] Appl. No.: 438,720

[22] Filed: May 11, 1995

[51] Int. Cl.$^6$ .................................................. H03K 3/037
[52] U.S. Cl. ............................................ 327/143; 327/198
[58] Field of Search ...................................... 327/143, 198

[56] References Cited

U.S. PATENT DOCUMENTS 5,414,307  5/1995  Brandmaier ............................ 327/143

FOREIGN PATENT DOCUMENTS 362161212  7/1987  Japan .................................... 327/198

OTHER PUBLICATIONS

Microprocessors and Microsystems, Jun. 1994, vol. 18, No. 5, "Microprocessor Supervisory Circuits," pp. 291–296.

*Primary Examiner*—Margaret Rose Wambach
*Attorney, Agent, or Firm*—James H. Fox

[57] ABSTRACT

Briefly, in accordance with one embodiment of the invention, a method of reducing the power consumption of a pipelined signal processor embedded in an integrated circuit (IC), after applying power to the IC, comprises the step of: applying a sufficient number of internally generated clock pulses to the pipelined signal processor so as to place at least one bus in the signal processor pipeline in a predetermined state. Briefly, in accordance with another embodiment of the invention, an integrated circuit comprises: a power-up reset circuit for a pipelined signal processor. The power-up reset circuit includes a counter and a digital signal oscillator. The digital signal oscillator and counter are coupled in a configuration so as to provide a predetermined number of clock pulses substantially in response to a power-up signal. The configuration is adapted to be coupled to the pipelined signal processor.

12 Claims, 4 Drawing Sheets

| INSTR. CYCLE | CLOCK | INSTR. ADDRESS BUS (10) | INSTR. DATA SIGNAL BUS (20) | DAU DECODED INSTR. SIGNAL PORTION | ALU DECODED INSTR. SIGNAL PORTION | DATA ADDRESS SIGNAL BUS (30) | DATA SIGNAL BUS (40) |
|---|---|---|---|---|---|---|---|
| 1 | 1 | ADDR 0 | | | | | |
| 1 | 0 | | | | | | |
| 2 | 1 | | INSTR 0 | | | | |
| 2 | 0 | | | INSTR 0 | | | |
| 3 | 1 | | | | INSTR 0 | ADDR 0 | |
| 3 | 0 | | | | | | |
| 4 | 1 | | | | | | |
| 4 | 0 | | | | | | DATA 0 |

5,559,458

RESET CIRCUIT FOR A PIPELINED SIGNAL PROCESSOR

TECHNICAL FIELD

The invention relates to signal processors and, more particularly, to pipelined signal processors.

BACKGROUND OF THE INVENTION

Pipelined signal processors, such as digital signal processors (DSPs), for example, are well-known and used in a variety of applications. In this context, the term "signal processor" refers to a device or circuit for processing binary digital electrical signals, such as a general purpose microprocessor, a special purpose microprocessor, a digital signal processor (DSP), or another special purpose signal processor, such as an application specific integrated circuit (ASIC), for example. As low-power applications for these devices or circuits continue to proliferate, it becomes increasingly important to devise techniques for conserving the amount of power consumed by such devices or circuits. It would be desirable to identify situations in which a pipelined signal processor consumes more power than necessary and to provide a technique or method of reducing the amount of power consumed by the processor in those situations.

SUMMARY OF THE INVENTION

Briefly, in accordance with one embodiment of the invention, a method of reducing the power consumption of a pipelined signal processor embedded in an integrated circuit (IC), after applying power to the IC, comprises the step of: applying a sufficient number of internally generated clock pulses to the pipelined signal processor so as to place at least one bus in the signal processor pipeline in a predetermined state.

Briefly, in accordance with another embodiment of the invention, an integrated circuit comprises: a power-up reset circuit for a pipelined signal processor. The power-up reset circuit includes a counter and a digital signal oscillator. The digital signal oscillator and counter are coupled in a configuration so as to provide a predetermined number of clock pulses substantially in response to a power-up signal. The configuration is adapted to be coupled to the pipelined signal processor.

BRIEF DESCRIPTION OF THE DRAWINGS

This subject matter regarded as the invention is particularly pointed out and distinctly claimed in the concluding portion of the specification. The invention, however, both as to organization and method of operation, together with features, objects, and advantages thereof, may best be understood by reference to the following detailed description when read with the accompanying drawings in which:

DETAILED DESCRIPTION

Figure 1:
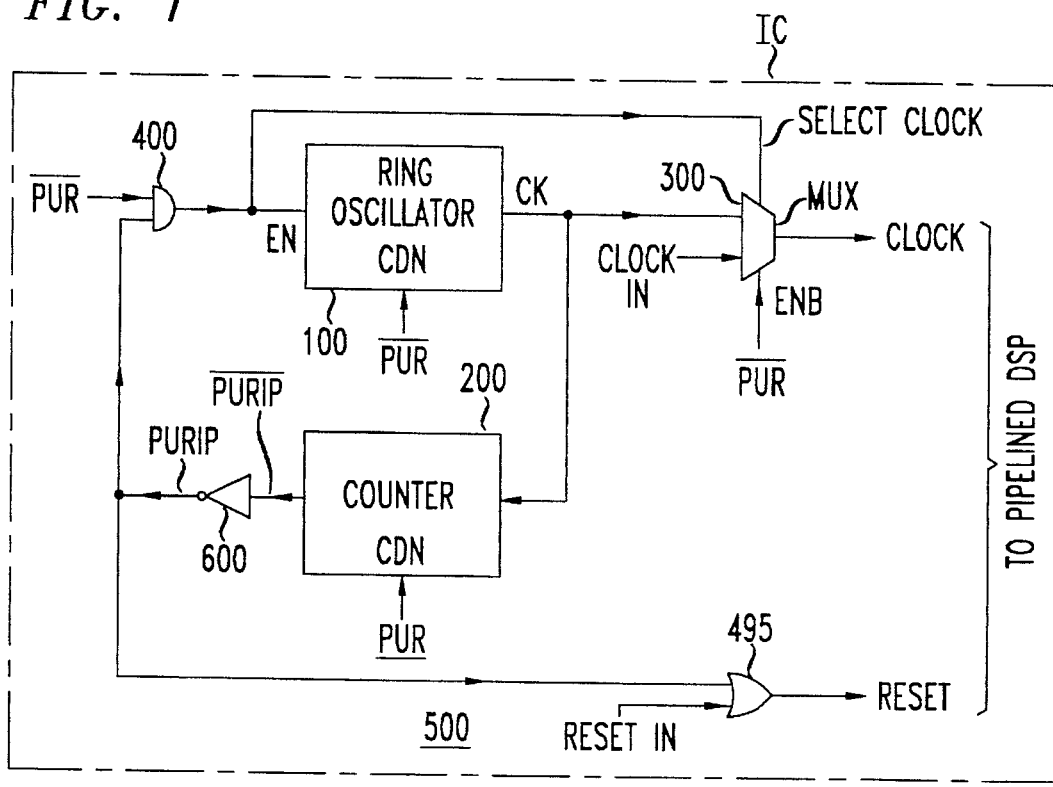
FIG. 1 is a schematic diagram illustrating an embodiment of a power-up reset circuit for a pipelined signal processor in accordance with the invention.

FIG. 1 illustrates an embodiment 500 of a power-up reset circuit for a pipelined signal processor, such as a digital signal processor (DSP), for example, in accordance with the invention. It is, of course, appreciated that the scope of the invention is not restricted to DSPs. For example, other signal processors, such as, for example, microprocessors and special purpose signal processors, such as, for example, ASICs, may employ an embodiment of a power-up reset circuit in accordance with the invention, such as the embodiment shown in FIG. 1. Embodiment 500 is provided on an integrated circuit (IC) that includes a pipelined DSP, such as illustrated in FIG. 4. Of course, the scope of the invention is not limited to this particular DSP. As illustrated in FIG. 1, embodiment 500 includes a digital signal oscillator 100 and a counter 200. In this particular embodiment, the digital signal oscillator comprises a ring-oscillator. Furthermore, although the invention is not limited in scope in this respect, the ring oscillator and counter are coupled in a configuration so as to provide a predetermined number of clock pulses to the pipelined DSP substantially in response to a power-up signal. In this particular embodiment, the power-up signal is generated internally by the IC, although the scope of the invention is not limited in this respect. Upon execution of the predetermined number of clock pulses, the DSP pipeline may be placed in a predetermined, low-power state, as explained in more detail hereinafter. Of course, the predetermined number of clock pulses may also include more clock pulses than the number necessary to place the DSP pipeline in the predetermined state, such as for reasons related to other aspects of circuit operation.

As illustrated in FIG. 1, in this particular embodiment, the configuration further includes a multiplexer (MUX) 300, an OR gate 495, an AND gate 400, and an inverter 600. FIG. 1 illustrates a signal $\overline{PUR}$ to indicate an inverted "power-up reset signal." Thus, in this particular embodiment, the $\overline{PUR}$ signal may be characterized as "zero" or "low" during power up, e.g., as power is applied to the IC, and "high" or "one" when the voltage applied to the IC via the IC coupling to the power supply is above a predetermined threshold voltage, such as $V_T$. In this particular embodiment, $V_T$ may comprise a voltage level substantially corresponding to a predetermined threshold voltage, where $V_T < V_{DD}$, $V_{DD}$ being the predetermined power supply voltage level for the IC. For example, $V_T$ may be a relative low voltage, such as a voltage level only of sufficiently high magnitude so that an inverter will operate satisfactorily, although the scope of the invention is not restricted in this respect. It will, of course, be appreciated that while the $\overline{PUR}$ signal may be characterized as an "active low" signal in this embodiment, the scope of the invention is also not restricted to this particular binary digital signaling convention. During an interval in which a "power-up" signal begins to be asserted, such as described above, counter 200 and ring oscillator 100 are "cleared" or reset due to application of the inverted power-up reset ( $\overline{PUR}$) signal to the "clear data not" or CDN port of ring oscillator 100 and counter 200 in this particular embodiment. Likewise, as shown in FIG. 1, the $\overline{PUR}$ signal is also applied to MUX 300 to effectively block clock or timing signals during the initial "power-up" period. As a result of this reset operation of counter 200, the signal designated in FIG. 1 as $\overline{PURIP}$, the inverted "power-up reset in process" signal in this particular embodiment, becomes "low," at least after this reset operation. Thus, signal PURIP, the "power-up reset in process" signal, becomes "high," due to inverter 600. Although the specific circuitry to provide the PURIP signal is not explicitly illustrated in FIG. 1, any one of a number of different embodiments are possible. For example, inverting the most significant bit (MSB) of counter 200 to obtain the PURIP signal may suffice.

After the output signal of inverter 600 transitions to a "high" state, this signal may be applied as an internally-derived or internally-generated reset signal to the pipelined DSP, such as via OR gate 495 as illustrated. Although not specifically illustrated in FIG. 1, this internal reset signal may be employed to clear one or more registers in the pipelined DSP.

Eventually, the inverted power-up reset signal, $\overline{PUR}$, becomes high due to the application of power to the integrated circuit, in this particular embodiment. Thus, an enable signal, EN, may be applied to ring oscillator 100 via AND gate 400. The EN signal initiates a clock signal, CK, produced by ring oscillator 100 in this embodiment. As illustrated, the enable signal, EN, produced by AND gate 400 may likewise be applied to MUX 300. A desirable effect of applying the enable signal, EN, to MUX 300 is to select the ring oscillator output signal as the signal to be provided via MUX 300 to the pipelined DSP. Alternatively, if the output signal of the ring oscillator were not selected, then in this particular embodiment MUX 300 may provide to the pipelined DSP an externally-derived clock signal, such as an externally-derived clock signal coupled to a pin or terminal (not shown) of the integrated circuit. The coupling for this externally-derived signal to MUX 300 is indicated in FIG. 1 by the input port to MUX 300 labeled "clock in."

In this embodiment, in addition to providing a clock signal to the pipelined DSP, the clock signal, CK, is also provided to counter 200, as illustrated in FIG. 1. Therefore, once ring oscillator 100 is enabled and an internal reset signal is applied, such as in the manner previously described, to the pipelined DSP to "clear"the registers in the DSP pipeline e.g., place the registers in a predetermined signal state, clock signal, CK, may be applied to the pipelined DSP so that the predetermined signals that now comprise the contents of the pipeline registers may be "clocked" through the pipeline so that the pipeline may be "cleared" or placed in a predetermined state.

If this process were not performed, then the pipeline stages, and particularly one or more buses for the pipelined DSP, may, instead, potentially occupy an unknown state. This would have several disadvantages. First, this may leave various stages of the pipeline, such as one or more pipeline buses, in a state that may consume additional power unnecessarily. For example, various bus drivers may be in conflicting states, potentially resulting in bus contention or floating nodes, depending upon the state of the particular bus drivers. Instead, placing the pipeline stages in a predetermined state helps ensure that this extra or additional power is not consumed unnecessarily. Furthermore, generating the appropriate signals internally provides an advantage over externally generated signals. For example, generating the signals internally avoids powering an external board, which may consume additional power unnecessarily. Furthermore, internal signals may be generated more quickly and, typically, are faster, resulting in additional energy savings in terms of reduced power consumption. The internal signals are generated more quickly because signal generation begins upon achieving $V_T$, which may be a relatively low voltage, as previously discussed. Also, an external oscillator may need additional time to settle or develop a signal in comparison with an on-chip oscillator. Furthermore, the internal signals are typically faster because an external signal usually provides a low frequency clock pulse that will satisfy a variety of different chip environments. In addition, to use the pipelined DSP, it is desirable to "clear" the stages, e.g., place the pipeline stages in a predetermined state, otherwise unpredictable results may be obtained which would be undesirable doing actual pipeline operation.

Depending upon the particular pipelined DSP or other signal processor employed, a predetermined number of clock pulses need only be applied to the pipeline to place the pipeline in a predetermined state. Of course, as previously indicated, additional clock pulses may be provided for other reasons as well. Thus, counter 200 may be configured so that after a predetermined number of clock pulses are applied to counter 200, such as by ring oscillator 100, the signal produced by inverter 600 in FIG. 1 achieves a "low" state. As illustrated in FIG. 1, this halts the operation of ring oscillator 100 via AND gate 400 and ensures that an externally-derived reset signal, indicated in FIG. 1 by "reset in," and an externally-derived clock signal may now be applied to the pipelined DSP, instead of the internally generated reset signal and internally generated clock signal, CK, as previously described.

Figure 6:
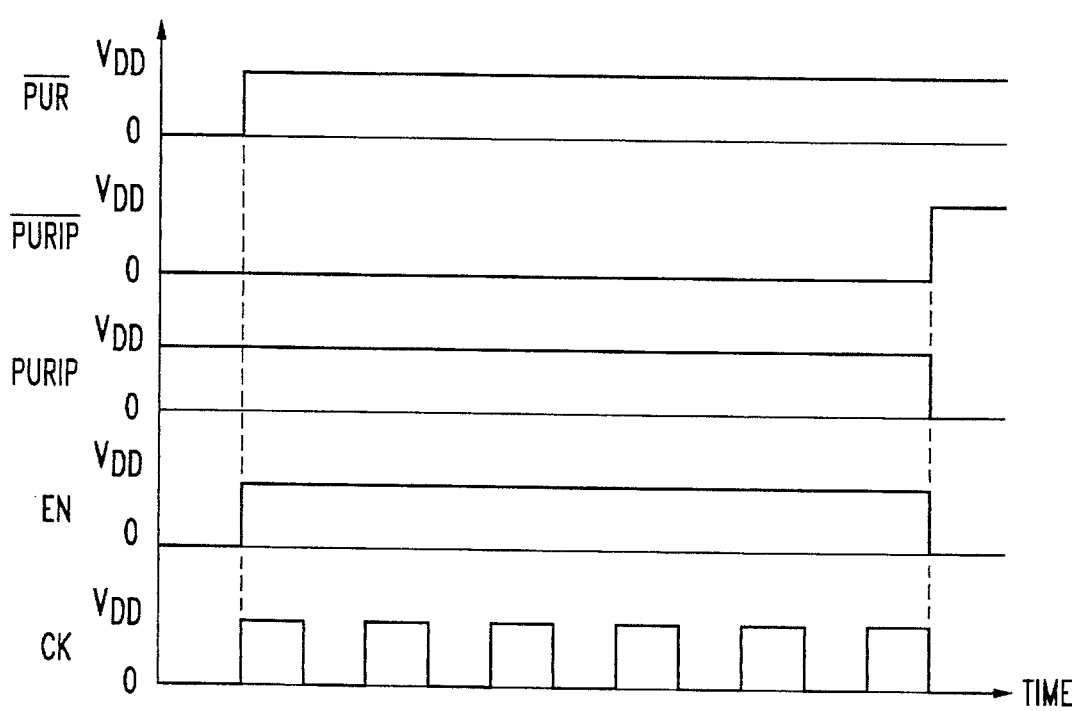
FIG. 6 is a timing diagram illustrating the temporal relationship of various signals for the embodiment illustrated in FIG. 1.

FIG. 6 is a timing diagram illustrating the temporal relationships of various signals of the embodiment illustrated in FIG. 1. As illustrated in FIG. 6, 6 internally generated clock pulses are provided to place the DSP pipeline in a predetermined state, although this is merely for purposes of illustration and the invention is not restricted in scope in this respect. The number of clock pulses will depend on the particular embodiment, of course.

Figure 2:
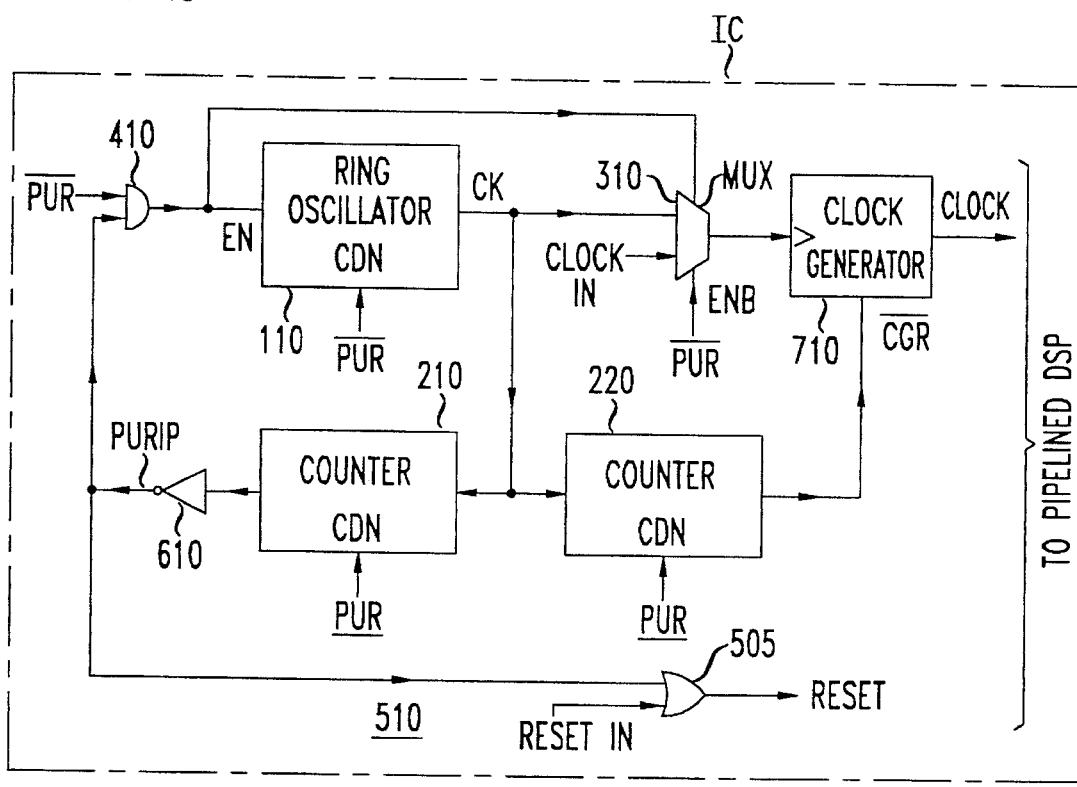
FIG. 2 is a schematic diagram illustrating an alternative embodiment of a power-up reset circuit for a pipelined signal processor in accordance with the invention.

FIG. 2 is a schematic diagram illustrating an alternative embodiment 505 of a power-up reset circuit for a pipelined signal processor in accordance with the invention. As illustrated, embodiment 510 includes an AND gate 410, a ring-oscillator 110, a MUX 310, a counter 210, an inverter 610, and an OR gate 505. In addition, embodiment 510 includes a counter 220 and a clock generator 710. Clock generator 710 provides a clock signal that may be provided to portions of other circuitry, such as the DSP circuitry, for example, to ensure that timing operations are sufficiently aligned. This is particularly desirable where, as here, the DSP or other signal processor is embedded in an IC. Typically, such a clock generator will in some manner modify the clock signal provided, such as provided via MUX 310 in this embodiment. In comparison with the embodiment illustrated in FIG. 1, embodiment 510 illustrated in FIG. 2 generates an additional signal to initiate or reset clock generator 710. As illustrated, clock generator 710 is gated to the clock signal provided via MUX 310. However, counter 210 and counter 220 are both configured in the circuit so as to reach only a predetermined number of clock pulses to conserve power. In this particular embodiment, however, counter 220 ceases counting before counter 210. Furthermore, upon reaching a first predetermined number of clock pulses, counter 220 provides a signal to the inverted clock generator reset ($\overline{CGR}$) port, as illustrated in FIG. 2. The circuitry to provide this signal from counter 220 is not shown, although any one of a number of embodiments will suffice, such as employing the most significant bit (MSB) of counter 220. Thus, clock generator 710 may be reset to permit the clock signal produced by clock generator 710 to have an edge aligned with the clock signal produced or generated by ring-oscillator 110. Likewise, counter 210 is configured in the circuit so as to reach a second predetermined number of clock pulses, this second predetermined number exceeding the first predetermined number in this embodiment. As described with respect to counter 200 for the embodiment illustrated in FIG. 1, upon reaching this second predetermined number of clock pulses, counter 210 in this particular embodiment provides a signal to inverter 610. Again, FIG. 5 is a timing diagram illustrating the temporal relationship for various signals for the embodiment just described.

Figure 3:
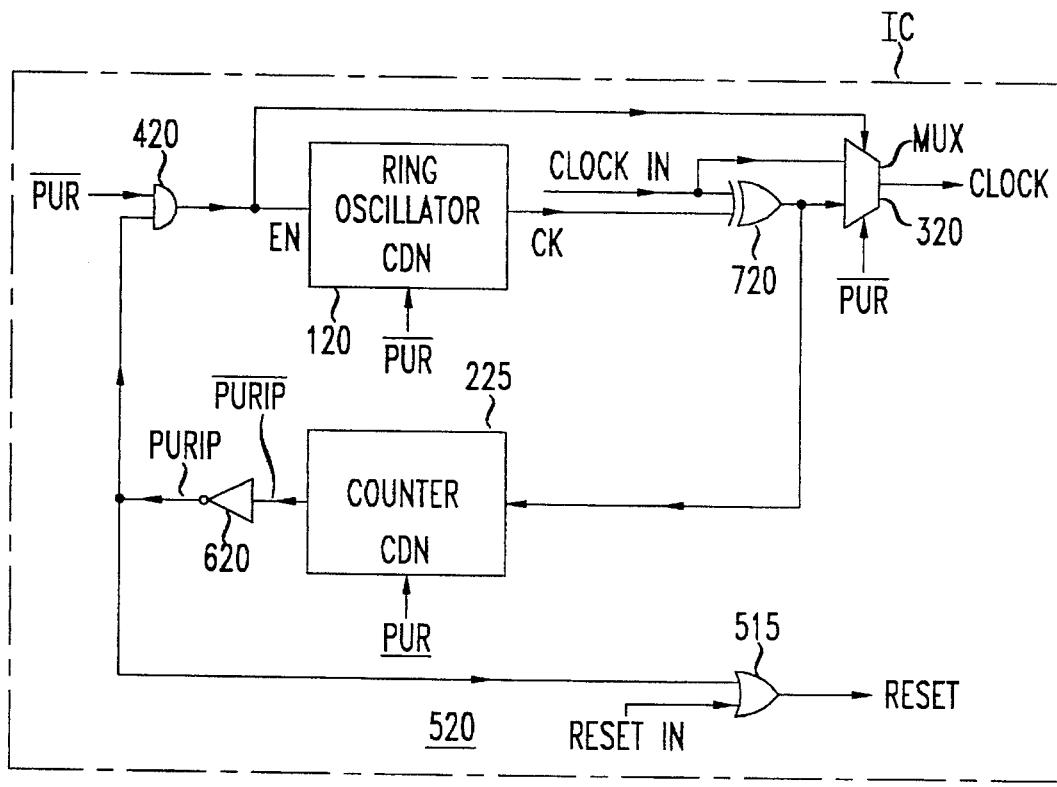
FIG. 3 is a schematic diagram illustrating still another embodiment of a power-up reset circuit for a pipelined signal processor in accordance with the invention.

FIG. 3 is a schematic diagram illustrating still yet another embodiment of a power-up reset circuit for a pipelined signal processor in accordance with the invention. This particular embodiment, 520, includes an AND gate 420, a ring oscillator 120, a MUX 320, a counter 225, an OR gate 515, and an inverter 620. In addition, this particular embodiment includes exclusive OR gate 720. The operation of this particular embodiment of a power-up reset circuit for pipelined signal processor in accordance with the invention is similar to the previous embodiments described. However, in this particular embodiment, exclusive OR gate 720 is included as a "back-up" mechanism to help ensure satisfactory circuit operation even under adverse circumstances. More particularly, if for some unknown reason, the power-up reset circuit for a pipelined signal processor in accordance with the invention were not to function as desired, exclusive OR gate 720 provides a mechanism whereby an externally-derived clock signal may be provided, such as via exclusive OR gate 720 and MUX 320, to the pipelined signal processor so that proper operation of the pipelined signal processor may nonetheless take place.

Figure 4A:
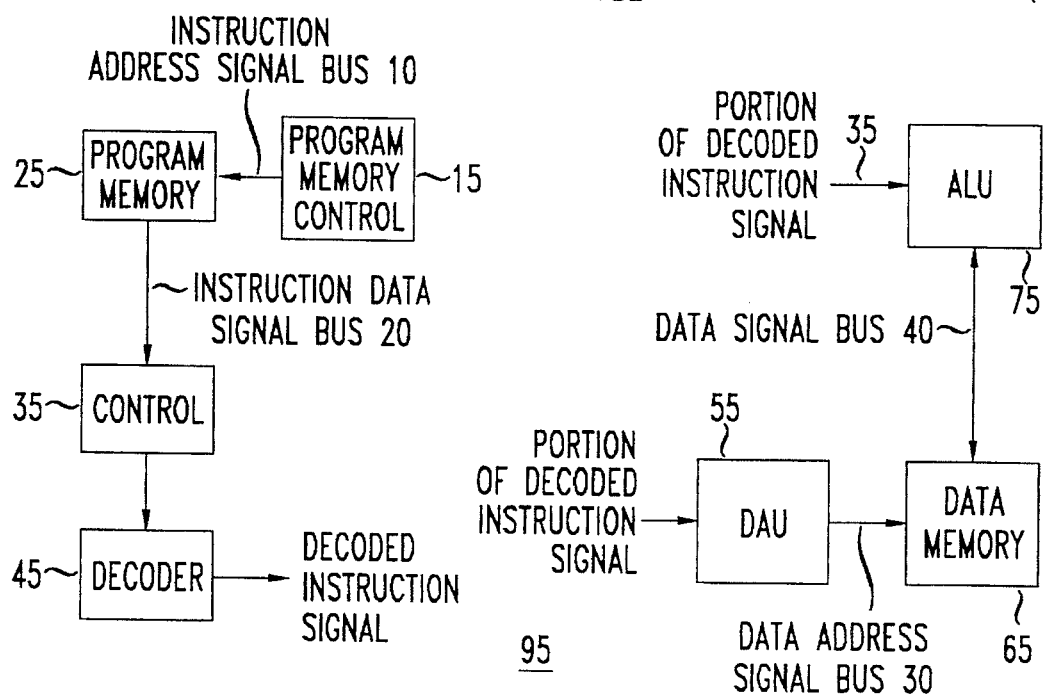
FIGS. 4A and 4B are schematic diagrams respectively illustrating an embodiment of a pipelined signal processor and a timing diagram associated with the embodiment.
Figures 4B, 5:
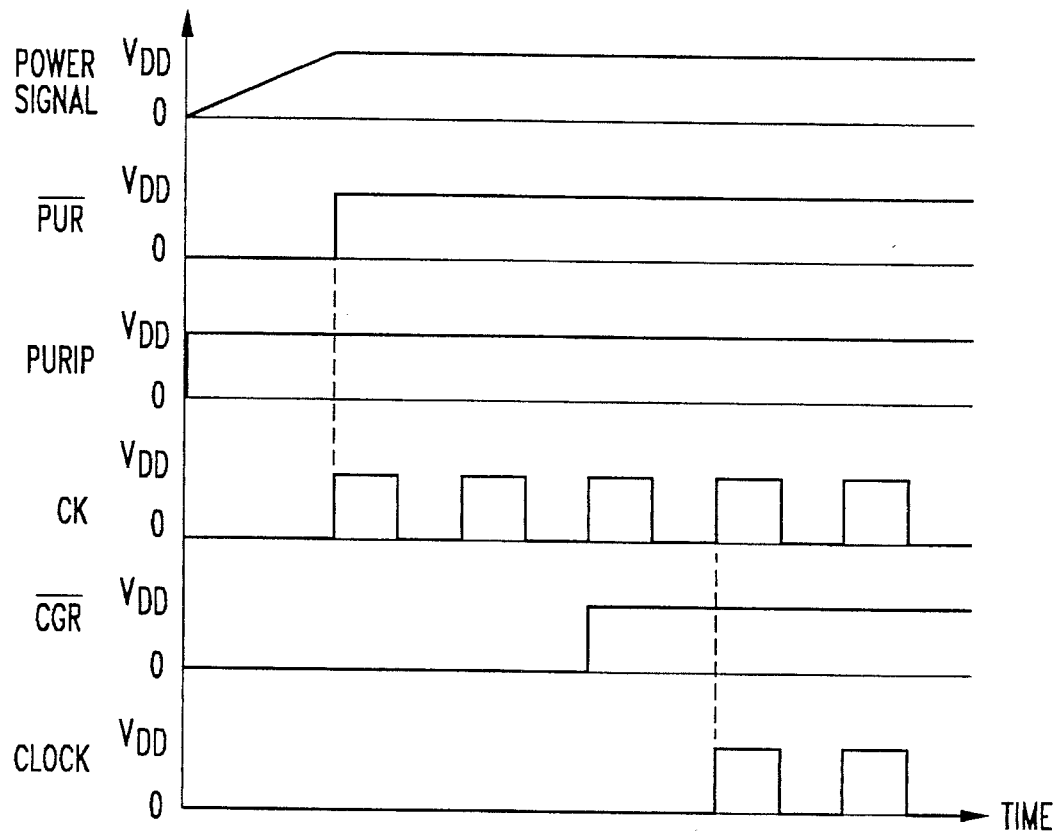
FIG. 5 is a timing diagram illustrating the temporal relationship of various signals for the embodiment illustrated in FIG. 2.

FIG. 4A is a high level schematic diagram illustrating an embodiment of a pipelined signal processor, although the invention is not restricted in scope to this particular pipelined signal processor. Pipelined signal processors are well-known in the art and this particular embodiment, 95, is provided merely for purposes of illustration.

As illustrated, embodiment 95 includes a program address control 15. Program address control 15 may be addressed by a counter (not shown), for example. As a result of binary digital signals provided to the program address control, such as from a counter, program address control 15 may provide an instruction address signal, in the form of binary digital signals, via instruction address signal bus 10 to program memory 25. In this particular embodiment, program address control 15 operates so as to address instructions for executing a program stored in program memory 25. Thus, this particular pipelined signal processor is illustrated in the form of a "Harvard Architecture," although the scope of the invention is not restricted in scope in this respect.

As a result of the instruction address signal provided via instruction address signal bus 10, program memory 25 may be addressed and provide an instruction data signal that is stored in the particular memory location indicated by the instruction address signal. This instruction data signal may then be provided via instruction data signal bus 20 to control 35. As a result of receiving the instruction data signal via instruction data signal bus 20, control 35 may provide signals to decoder 45. Decoder 45 may decode the signals provided by control 35 into a decoded instruction signal.

As further illustrated in FIG. 4A, portions of this decoded instruction signal may be provided to arithmetic logic unit (ALU) 75 and also to data addressing unit (DAU) 55. Thus, in this particular embodiment, a portion of the decoded instruction signal provided by decoder 45 may signal to arithmetic logic unit 75 the operations to be performed by the arithmetic logic unit. Likewise, another portion of the decoded instruction signal provided by decoder 45 may signal to DAU 55 the address locations in data memory 65 containing the operands to be operated upon by ALU 75. Therefore, the portion of the decoded instruction signal provided to DAU 55 may result in a data address signal being provided to data memory 65 via data address signal bus 30. Likewise, as a result of the data address signal provided via bus 30, data memory 65 may provide signals to data signal bus 40 to thereby be provided to ALU 75. The data signal provided by data memory 65 to ALU 75 via bus 40 is to be operated upon in a manner indicated by the portion of the decoded instruction signal provided to ALU 75. Furthermore, in this manner, additional instructions may be executed. For example, for the next decoded instruction, the result of the operation performed by ALU 75 on the one or more previously provided data signals may now be provided to data memory 65 via data signal bus 40 to be stored in a memory location determined based upon the data address signal provided from DAU 55 via data address signal bus 30 to data memory 65. Likewise, this data address signal may be based upon a portion of a decoded instruction signal provided to DAU 55. As another example, instead, the result of the operation may be operated upon by ALU 75 and the operation may involve another data signal obtained from data memory 65.

Of course, typically the sequence of pipeline operations is synchronized or controlled by a synchronizing clock signal (not shown). This sequence of operations is depicted in FIG. 4B in a timing diagram illustrating four instruction cycles comprising eight clock pulses in this particular embodiment. Thus, the timing diagram in FIG. 4B illustrates that in this particular embodiment it takes four instruction cycles or eight clock pulses to place the pipeline buses, such as, for example, data signal bus 40 in FIG. 4A, in a predetermined state so that power consumption is reduced, as previously described. As illustrated in FIG. 4B, an instruction address signal is placed on instruction address signal bus 10 during the two clock pulses of instruction cycle one. An instruction data signal is provided on signal bus 20 during the first clock pulse of instruction cycle two. Likewise, a portion of a decoded instruction signal is provided to DAU 55 during the second clock pulse of the second instruction cycle. During the first clock pulse of the third instruction cycle, another portion of a decoded instruction signal is provided to ALU 75. Likewise, during the first clock pulse of the third instruction cycle, a data address signal is provided on signal bus 30. Thus, as indicated in FIG. 4, the state of signal bus 40 is determined by the completion of the second clock pulse of the fourth instruction cycle. Assuming this is the first instruction to be executed by the pipeline after power-up, this illustrates that it takes four instruction cycles or eight clock pulses, in this particular embodiment, to place the pipeline in a predetermined state. Thus, before the second clock pulse of the fourth instruction cycle, in this particular embodiment, it may be difficult to predict the state of the pipeline buses and, therefore, more power than necessary may otherwise be consumed. Of course, for an embodiment of a power-up reset circuit for a pipelined signal processor in accordance with the invention, advantages may be obtained by placing at least one bus in the pipeline in a predetermined state.

An embodiment of a power-up reset circuit for a pipelined signal processor in accordance with the invention, such as the embodiments illustrated in FIGS. 1, 2, and 3, may also be configured so as to perform a variety of operations. For an embodiment embedded in an integrated circuit, a reset signal may be asserted internally on the integrated circuit regardless of the reset signal provided to the integrated circuit via a terminal coupling (not shown) to the integrated circuit, such as a reset terminal for receiving an externally-derived reset signal. Likewise, an internal clock source, such as a digital signal oscillator, for example, may provide a clock signal during this period while externally-derived clock signal(s), such as those available through integrated circuit pin(s) or terminal(s) (not shown), are blocked. The internal clock source may operate so as to provide a sufficient number of clock pulses to clear, reset or place at least one bus of the pipeline in a predetermined state. Ultimately, the internal clock source may be halted in order to conserve power and the internal reset override may be cancelled or deasserted.

A power-up reset circuit for a pipelined signal processor, such as illustrated by the embodiments shown in FIGS. 1, 2 and 3, provides a number of advantages. For example, initialization of the pipelined signal processor may be characterized as "automatic" upon application of power to an integrated circuit, for example. More specifically, if a valid clock signal is to be applied to the integrated circuit chip after the inverted power-up reset ($\overline{PUR}$) signal reaches $V_{DD}$, the DSP or other processor may be placed in a state ready to execute the first instruction on the first externally-derived clock pulse. This is an advantage in that it reduces overhead and avoids employing an externally-derived clock pulse to place the circuit in this ready state. Likewise, in an alternative embodiment of a power-up reset circuit for a pipelined signal processor in accordance with the invention, if a power "glitch" or other signaling anomaly disturbs or disrupts the operation of the DSP or other processor on the integrated circuit, for example, the configuration employed may "automatically" provide appropriate signals to place the signal processor pipeline in a ready state. Typically, such power anomalies are sensed externally, however, here this may be accomplished by an integrated circuit including an embodiment of a power-up reset circuit for a pipelined signal processor in accordance with the invention. In yet another embodiment of a power-up reset circuit for a pipelined signal processor in accordance with the invention, the circuit may be configured so as to perform a variety of initialization tasks during power-up and may return to a dormant or predetermined state when these tasks are completed. A benefit of this approach is that further processor operation may then be triggered upon receipt of an interrupt signal, which would again reduce overhead associated with placing the pipeline in a predetermined state, since various initialization operations would have already been completed. Furthermore, as previously indicated, placing the pipeline in a predetermined state may also reduce power consumption.

An embodiment of a method of reducing the power consumption of a pipelined signal processor embedded in an integrated circuit may be accomplished in the following manner. First, power may be applied to the integrated circuit, such as to an external terminal or coupling of the integrated circuit. Likewise, a power-up reset signal may be generated internally to the integrated circuit. Then, an internally generated reset signal may be applied to the signal processor pipeline, such as to at least one register. For example, as previously described, for the embodiment illustrated in FIG. 1, counter 200 may be reset resulting in an internally generated reset signal provided to the signal processor pipeline, such as via OR gate 495 for the embodiment illustrated in FIG. 1. A sufficient number of internally generated clock pulses may then be applied to the signal processor pipeline so as to place at least one bus in the signal processor pipeline in a predetermined state. For example, as previously described with regard to the embodiment illustrated in FIG. 1, a digital signal oscillator, such as ring-oscillator 100 in FIG. 1, may be enabled and the clock signal produced by the ting-oscillator may be provided to the pipelined signal processor, such as via MUX 300 in FIG. 1. Furthermore, the internally generated clock pulses produced by the digital signal oscillator may also be provided to a counter, such as counter 200 for the embodiment illustrated in FIG. 1, and upon reaching a predetermined number of clock pulses, the enable signal provided to the digital signal oscillator, such as ring-oscillator 100, may change state in order to halt the oscillator, thereby conserving power. Likewise, as previously described, such as with respect to the pipelined signal processor illustrated in FIG. 1, upon completion of this sufficient number of clock pulses, one or more buses of the pipelined signal processor may be placed in a predetermined state to reduce power consumption.

While only certain features of the invention have illustrated and described herein, many modifications, substitutions, changes or equivalents will not occur to those skilled in the art. It is, therefore, to be understood that the appended claims are intended to cover all such modifications and changes as fall within the true spirit of the invention.

The invention claimed is:

1. An integrated circuit comprising:

a power-up reset circuit for a pipelined signal processor, said power-up reset circuit including:

a counter; and a digital signal oscillator;

said digital signal oscillator and said counter being coupled in a configuration so as to provide a predetermined number of clock pulses substantially in response to a power-up signal and with the oscillator being coupled to a multiplexer;

wherein said multiplexer initially selects said digital signal oscillator during a power-up period, and thereafter selects said an operational clock source, as the source of clock pulses to said pipelined processor.

2. The integrated circuit of claim 1, wherein the predetermined number of clock pulses comprises a sufficient number of clock pulses so as to place at least one bus of said pipelined signal processor in a predetermined state.

3. The integrated circuit of claim 1, wherein said digital signal oscillator comprises a ring-oscillator.

4. The integrated circuit of claim 1, wherein said pipelined signal processor comprises a pipelined signal processor selected form the group consisting essentially of a pipelined DSP, a pipelined ASIC, and a pipelined microprocessor.

5. The integrated circuit of claim 1, wherein said counter comprises a first counter; and wherein the configuration in which said digital signal oscillator and said first counter are coupled comprises a configuration coupled so as to provide a first predetermined number of clock pulses;

wherein the configuration further comprises a second counter;

said digital signal oscillator and said second counter being coupled in the configuration so as to provide a clock generator reset signal after a second predetermined number of clock pulses;

said first predetermined number of clock pulses exceeding said second predetermined number of clock pulses.

6. The integrated circuit of claim 1, wherein the configuration further comprises an exclusive OR gate, said exclusive OR gate being coupled in the configuration so as to provide a clock signal selected from the group consisting essentially of the predetermined number of clock pulses and an externally-derived clock signal.

7. The integrated circuit of claim 1, wherein the power-up signal comprises an internally generated power-up signal.

8. A method of reducing the power consumption of a pipelined signal processor embedded in an integrated circuit (IC), after applying power to the IC, said method comprising the steps of:

applying an internally generated reset signal to at least one register in the signal processor pipeline; and applying a sufficient number of clock pulses to said signal processor pipeline from an internal source so as to place at least one bus in said signal processor pipeline in a predetermined state, and thereafter applying to said signal processor pipeline clock pulses from an operational clock that is different than said internal source.

9. The method of claim 8, wherein the step of applying a sufficient number of internally generated clock pulses includes:

blocking the application of an externally-derived clock signal to said pipelined signal processor.

10. The method of claim 8, wherein the step of applying a sufficient number of internally generated clock pulses comprises applying a sufficient number of internally generated clock pulses to said signal processor pipeline so as to place each bus of said signal processor pipeline in a predetermined state.

11. The method of claim 8, wherein the step of applying a sufficient number of internally generated clock pulses includes generating the clock pulses using a digital signal oscillator.

12. The method of claim 11, wherein the step of applying a sufficient number of internally generated clock pulses includes determining the number of clock pulses generated using a counter.

* * * * *